United States Patent
Kim

(10) Patent No.: US 8,085,601 B2
(45) Date of Patent: Dec. 27, 2011

(54) PROGRAMMING METHOD AND INITIAL CHARGING METHOD OF NONVOLATILE MEMORY DEVICE

(75) Inventor: Hyunggon Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 327 days.

(21) Appl. No.: 12/567,819

(22) Filed: Sep. 28, 2009

(65) Prior Publication Data

US 2010/0091575 A1 Apr. 15, 2010

(30) Foreign Application Priority Data

Oct. 13, 2008 (KR) ........................ 10-2008-0099943

(51) Int. Cl.
*G11C 11/34* (2006.01)
(52) U.S. Cl. .................. 365/185.25; 365/203
(58) Field of Classification Search ............. 365/185.25, 365/203
See application file for complete search history.

(56) References Cited

U.S. PATENT DOCUMENTS

| | | | |
|---|---|---|---|
| 6,667,921 B2 * | 12/2003 | Park | ............................ 365/203 |
| 7,099,193 B2 | 8/2006 | Futatsuyama | |
| 2006/0239069 A1 | 10/2006 | Kamigaichi et al. | |
| 2008/0089130 A1 | 4/2008 | Park | |

FOREIGN PATENT DOCUMENTS

| | | |
|---|---|---|
| JP | 2005-108404 | 4/2005 |
| JP | 2006-302411 | 11/2006 |
| KR | 1020050025907 A | 3/2005 |
| KR | 1020060110799 A | 10/2006 |
| KR | 100770754 B1 | 10/2007 |

* cited by examiner

*Primary Examiner* — Son Dinh
*Assistant Examiner* — Nam Nguyen
(74) *Attorney, Agent, or Firm* — Volentine & Whitt, PLLC

(57) ABSTRACT

A programming method of a nonvolatile memory device includes precharging bit lines of the nonvolatile memory device based on loaded data, boosting channels corresponding to the respective precharged bit lines, after supplying word lines adjacent to a selected word line of the nonvolatile memory device with an initializing voltage, the selected word line is a word line selected for programming, and supplying a word line voltage for programming to the channels, after the channels are boosted.

11 Claims, 14 Drawing Sheets

PROGRAMMING METHOD AND INITIAL CHARGING METHOD OF NONVOLATILE MEMORY DEVICE

CROSS-REFERENCE TO RELATED APPLICATIONS

A claim of priority under 35 U.S.C §119 is made to Korean Patent Application No. 2008-99943, filed on Oct. 13, 2008, the entirety of which is incorporated herein by reference.

BACKGROUND

The inventive concepts described herein are generally related to a programming method and an initial charging method of a nonvolatile memory device.

In a nonvolatile memory device, data recorded in a cell does not expire even when power is not supplied to the nonvolatile memory device. Flash memories are widely used as nonvolatile memories in devices such as computers and memory cards since flash memories electrically erase data in bulk.

A flash memory may be characterized as either a NOR flash memory or a NAND flash memory depending on its connection state between a cell and a bit line. In general, a NOR flash memory may not be as highly integrated as other memories due to its large current consumption, but it may be used for its accelerated speed. A NAND flash memory may be highly integrated because it has lower cell current consumption than a NOR flash memory.

SUMMARY

Exemplary embodiments of the inventive concept are generally related to programming methods and initial charging methods of nonvolatile memory devices. In an embodiment of the inventive concept, a programming method of a nonvolatile memory device may include precharging bit lines of the non-volatile memory device based on loaded data; boosting channels corresponding to the respective precharged bit lines, after supplying word lines adjacent to a selected word line of the non-volatile memory device with an initializing voltage, the selected word line is a word line selected for programming; and supplying a word line voltage for programming to the channels, after the channels are boosted.

In another embodiment of the inventive concept, a programming method of a nonvolatile memory device may include precharging bit lines of the non-volatile memory device based on loaded data; boosting channels corresponding to the respective precharged bit lines, after an initializing voltage is supplied to word lines of the non-volatile memory device including from a word line located upwardly adjacent a selected word line to a word line adjacent a string selection line, or to word lines of the non-volatile memory device including from a word line located downwardly adjacent the selected word line to a word line adjacent a ground selection line, the selected word line is a word line selected for programming; and supplying a word line voltage for programming the channels, after the channels are boosted.

In yet another embodiment of the inventive concept, a memory system may include a nonvolatile memory device; and a memory controller configured to control the nonvolatile memory device, wherein the nonvolatile memory device precharges bit lines based on loaded data, boosts channels corresponding to the respective precharged bit lines after an initializing voltage is supplied to word lines adjacent to selected word line, and supplies a word line voltage for programming after the channels are boosted.

BRIEF DESCRIPTION OF THE DRAWINGS

The accompanying drawings are included to provide a further understanding of the embodiments of the inventive concept, and are incorporated in and constitute a part of this specification. The drawings illustrate examples of the embodiments of the inventive concept and, together with the description, serve to explain principles of the embodiments of the inventive concept, and wherein.

DETAILED DESCRIPTION OF THE EMBODIMENTS

Figure 1:
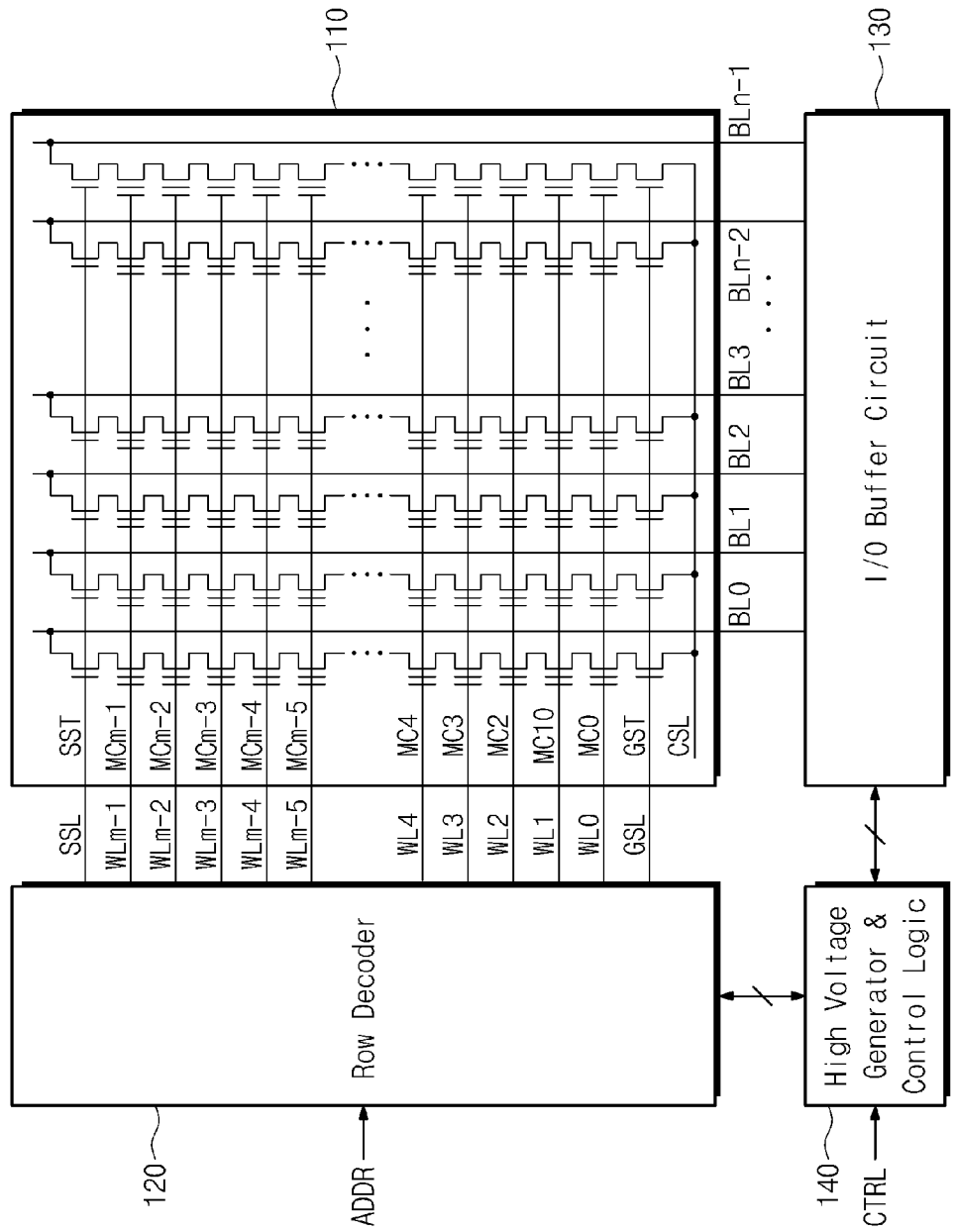
FIG. 1 is an exemplary embodiment of a nonvolatile memory device 100.

The embodiments of the inventive concept will now be described more fully hereinafter with reference to the accompanying drawings, in which embodiments of the inventive concept are shown. The inventive concepts however may be realized in many different forms and should not be construed as limited to the embodiments set forth herein. Rather, these embodiments of the inventive concept are provided so that this disclosure will be thorough and complete, and will fully convey the scope of the inventive concept to those skilled in the art. In the drawings, the thicknesses of layers and regions are exaggerated for clarity. Like numbers refer to like elements throughout the accompanying figures.

A nonvolatile memory device of an embodiment of the inventive concept performs an initial charge operation while supplying an initializing voltage to unselected word lines adjacent to selected word lines, in a bit line set-up interval of a programming operation. Thereby, the boosting of the channel is increased, and as a result the influence of program disturbance is decreased.

FIG. 1 is an exemplary embodiment of a nonvolatile memory device 100. Referring to FIG. 1, the nonvolatile memory device 100 includes a memory cell array 110, a row decoder 120, an input/output buffer circuit 130, and a high-voltage generator/control logic 140. The high-voltage generator/control logic 140 controls the row decoder 120 and input/output buffer circuit 130 to perform initial charging of a channel in a programming operation. Here, the initial charging operation refers to charging the channel with an initial charge in a bit line set-up interval. Such an initial charge operation decreases influence of a program disturbance. A detailed description will be made with reference to FIG. 2.

The nonvolatile memory device 100 of FIG. 1 is a NAND flash memory. However, the nonvolatile memory device is not limited to a NAND flash memory. The nonvolatile memory device of embodiments of the inventive concept may be various types of nonvolatile memory, for example, a NOR flash memory device, MRAM, PRAM, and FRAM. Also, the nonvolatile memory device may be realized as a three-dimensional array structure.

The memory cell array 110 includes a plurality of bit lines BL0-BLn−1, a plurality of word lines WL0-WLm−1, and a plurality of memory cells arranged in crossing sections of the bit lines and the word lines. Here, multi bit data may be stored in the respective memory cells. The memory cell array 110 may be constituted by a plurality of memory blocks. Only one example of a memory block is depicted in FIG. 1. Each of the memory blocks of the memory cell array 110 includes a plurality of cell strings. Each string, as shown in FIG. 1, includes a string selection transistor SST, and m number of memory cells MC0-MCm−1 connected in series between the ground selection transistor GST and the string selection transistor SST.

A drain of the string selection transistor SST of the respective strings is connected to a corresponding bit line, and a source of the ground selection transistor GST of the respective strings is connected to a common source line CSL. A plurality of word lines WL0-WLm−1 are arranged to cross the strings. The word lines WL0-WLm−1 are respectively connected to the memory cells MC0-MCm−1 corresponding to each string. Data may be programmed/read to/from selected memory cells by supplying program/read voltage to selected word lines. The bit lines BL0-BLn−1 are electrically connected to page buffers (not shown) of the input/output buffer circuit 130.

The row decoder 120 selects a memory block based on the inputted address ADDR, and selects to be driven a word line of the selected memory block. For example, during a programming operation row decoder 120 decodes the inputted address ADDR to select a word line to be driven from the selected memory block. Here, a program voltage form the high-voltage generator/control logic 140 is supplied to the selected word line.

The input/output buffer circuit 130 includes a plurality of page buffers (not shown) that temporarily store data to be loaded in the memory cell array 110 in a programming operation, or temporarily stores data read from the memory cell array 110 in a reading operation. The page buffers are connected to the memory cell array 110 via the corresponding bit lines BL0-BLn−1, respectively.

During a programming operation, the page buffers supply a ground voltage (e.g., 0V) or a power voltage Vcc to a bit line based on the loaded data. For example, a ground voltage 0V is supplied to the bit line connected to a page buffer in which data '0' is loaded (i.e., bit line connected to a program cell). Power voltage Vcc is supplied to a bit line connected to a page buffer in which data '1' is loaded (i.e., bit line connected to a program-inhibited cell).

The high-voltage generator/control logic 140 generates high-voltages required for each operation to supply to the row decoder 120 in response to inputted control signals (CTRL, for example, /CE, /RE, /WE, CLE, ALE, /WP), and controls entire operations of internal blocks of the nonvolatile memory device 100.

The high-voltage generator/control logic 140 turns on a string selection transistor so that an initial charge operation is performed in a bit line set-up interval, and is configured to supply an initializing voltage to the word lines adjacent to the selected word line. Here, the initializing voltage supplied to the adjacent word lines is a voltage sufficient to turn on a programmed cell. This initializing voltage is used to form a channel of which an initial charge may be transferred to a memory cell connected to a selected word line. A detailed description will be made with reference to FIG. 2.

The nonvolatile memory device 100 of the embodiment is configured to supply an initializing voltage to unselected word lines in a bit line set-up interval. Thereby the efficiency of boosting a channel may be enhanced, which results from initial charge operation in a programming operation of the nonvolatile memory device 100.

Figure 2:
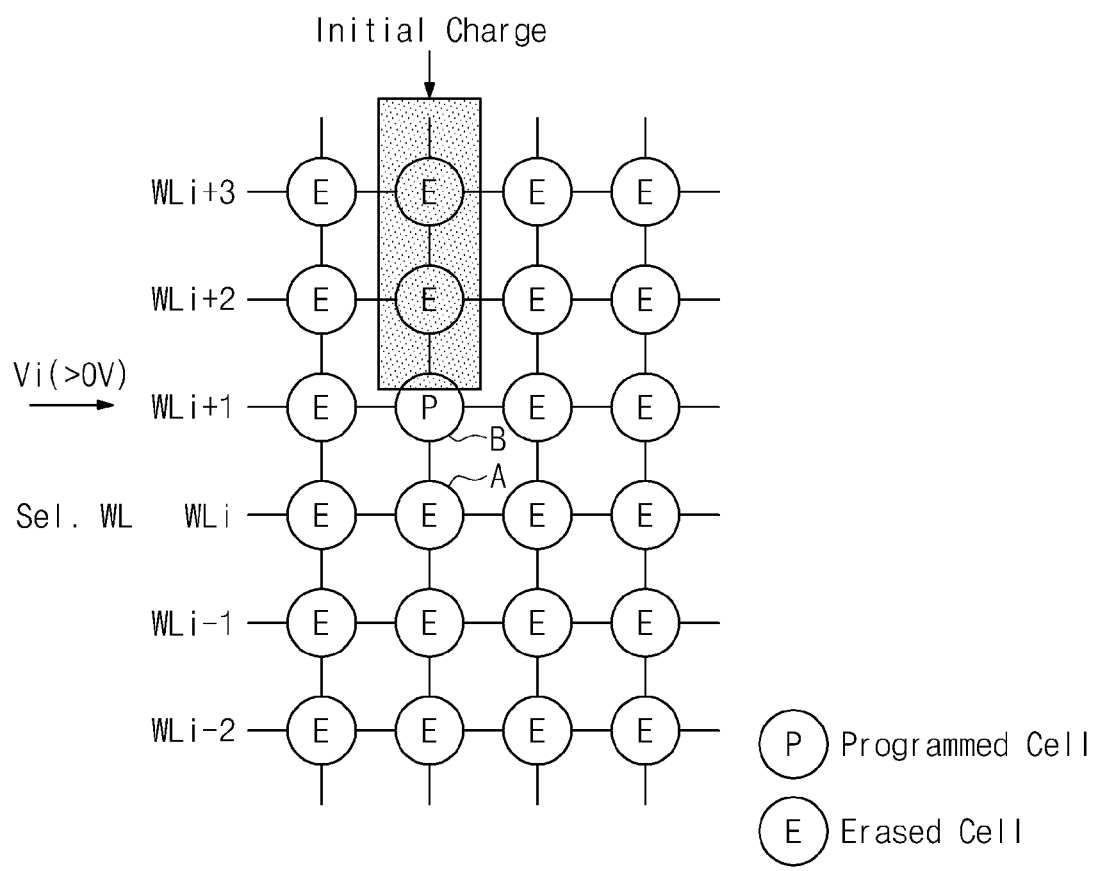
FIG. 2 illustrates an initial charge of a string including a program-inhibited cell during a programming operation of an embodiment of a nonvolatile memory device.

FIG. 2 illustrates an initial charge operation during a programming operation of an embodiment of a nonvolatile memory device 100. Referring to FIG. 2, 'P' is a programmed cell and 'E' is an erased cell. For description, it is assumed that a word line WLi is selected to perform a programming operation, and a memory cell B connected to a word line WLi+1 is in a programmed state.

An initial charging operation of a channel refers to charging an initial charge to a channel before a programming is performed, i.e., in a bit line set-up interval. Here, a voltage level due to the initial charge is equivalent to a voltage lower than a difference between a select voltage VSSL supplied to a string selection line and a threshold voltage Vth of a string selection transistor SST (i.e., a voltage lower than VSSL−Vth), or equivalent to a precharge voltage of a bit line.

In a typical nonvolatile memory device the initial charge is transferred only up to the programmed cell B. Therefore, a channel boosting of a string which includes a program-inhibited cell during a programming operation may fail. If the memory cell A is a program-inhibited cell, the memory cell A has a high possibility of being programmed due to influence from a program disturbance.

On the other hand, the nonvolatile memory device 100 supplies an initial voltage Vi to the word line WLi+1 adjacent to selected word lines in a bit line set-up interval, to transfer an initial charge up to at least the memory cell A. Here, the initial charge Vi is higher than 0V and lower than a pass voltage, which is sufficient to turn on a programmed cell.

The nonvolatile memory device 100 supplies the initializing voltage Vi to word lines adjacent to selected word line WLi, thereby the initial charge may be transferred to a memory cell connected to the selected word line WLi. As a result, the channel of a string of which a program-inhibited cell is included is boosted. Also, the program disturbance decreases as much as the channel is boosted.

Figure 3:
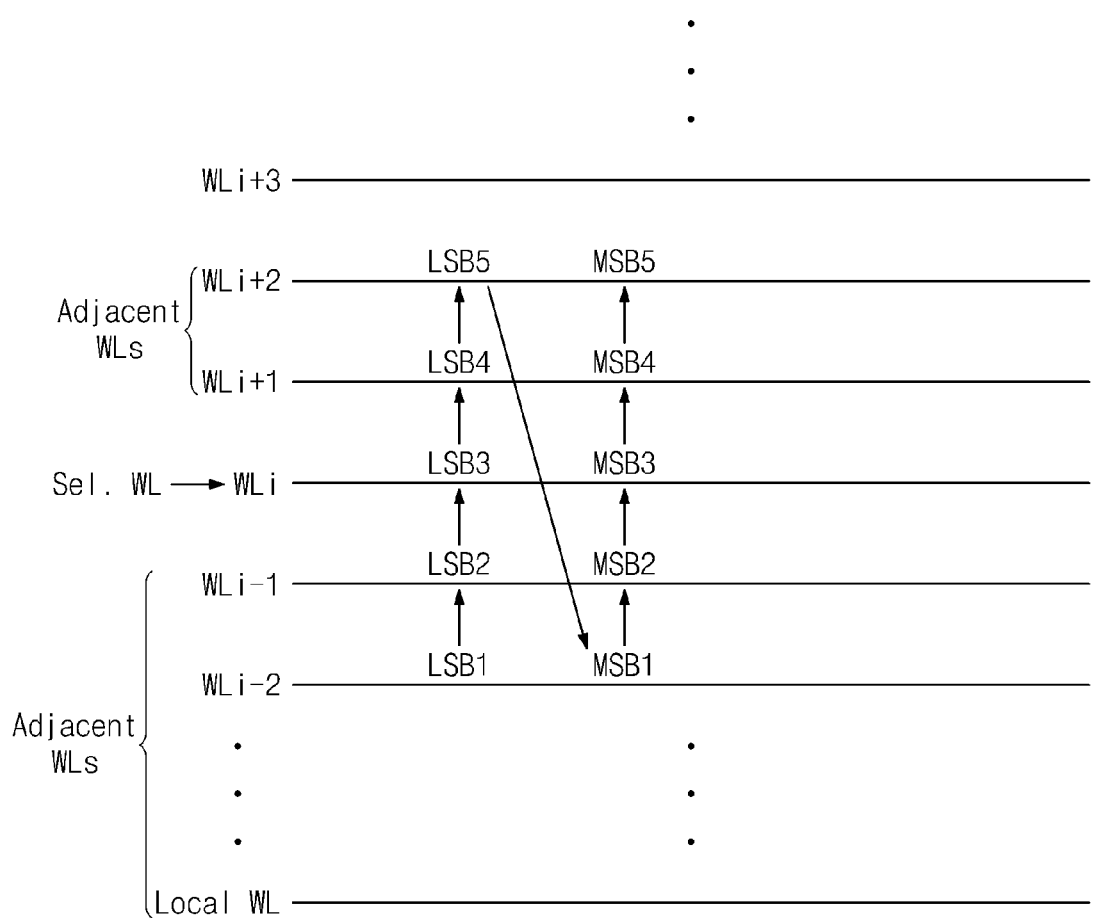
FIG. 3 is an exemplary embodiment of word lines adjacent to a selected word line as being supplied with an initializing voltage to perform an initial charge operation.

FIG. 3 is an exemplary embodiment of word lines adjacent to selected word line, the adjacent word lines supplied with an initializing voltage Vi to perform initial charge operation of a channel, in a nonvolatile memory device 100. Referring to FIG. 3, in the nonvolatile memory device 100, a LSB (least significant bits) programming operation is performed in the following order; word line WLi−2, word line WLi−1, word line WLi, word line WLi+1, and word line WLi+2. And an MSB (most significant bits) programming operation is performed in this order: word line WLi−2, word line WLi−1, word line WLi, word line WLi+1, and word line WLi+2. For description, it is assumed that the word line WLi is selected to perform the MSB programming operation. Here, the memory cells connected to the upper word lines WLi+1, WLi+2 of the selected word line WLi may already be in programmed states.

The nonvolatile memory device 100 supplies an initializing voltage Vi to the word lines adjacent to the selected word lines to increase efficiency of channel boosting. Here, the adjacent word lines may include at least the upper word lines WLi+1, WLi+2 of the selected word line WLi. Also, the adjacent word lines may further include from the lower word lines WLi−1 of the selected word line WLi to the local word line WL. The local word line WL is supplied with a local voltage (e.g., 2V, a voltage lower than a pass voltage) to prevent charge sharing with the memory cells connected to a lower word line programmed in a programming operation interval. The reason that a local voltage is supplied to the local word line WL in a programming operation interval is to block a path that may lead to charge sharing and prevent a program disturbance. The location of the local word line WL may be arbitrarily designated by a user. For example, for a 3 bit storage memory cell, the location of the local word line WL may be a third word line downward from the selected word line.

Figure 4:
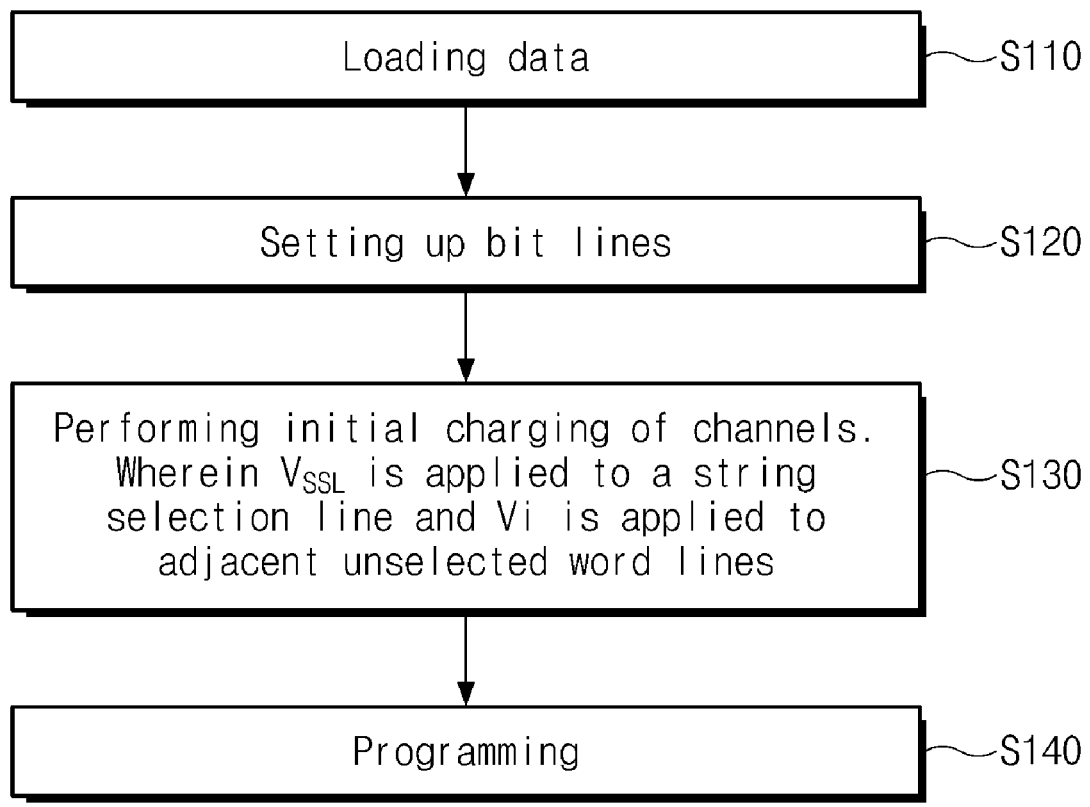
FIG. 4 is a flow chart of a programming method of an embodiment of a nonvolatile memory device.

FIG. 4 is a flow chart of a programming method of a nonvolatile memory device 100. Referring to FIG. 1 to FIG. 4, a programming method of the nonvolatile memory device 100 is as follows.

Data to be programmed are loaded in the respective page buffers of an input/output buffer 130 (S110). Precharge voltages are supplied to bit lines BL0-BLn−1 based on the loaded data. For example, if the data loaded in a page buffer is '1', a power voltage Vcc is supplied to a bit line corresponding to the page buffer. Also, if the data loaded in the page buffer is '0', a ground voltage 0V is supplied to a bit line corresponding to the page buffer (S120).

Sequentially, initial charge operation is performed in the respective channels. Here, an initial charge operation of the channel is performed by supplying a select voltage VSSL to a string selection line SSL, and supplying an initializing voltage Vi to word lines adjacent to the selected word line (S130).

Then a programming operation is performed by a programming voltage being supplied to the selected word line, and a pass voltage being supplied to the unselected word lines (S140). The programming method according to an embodiment of the inventive concept may be applied as Incremental Step Pulse Programming (ISPP).

In the programming method, an initializing voltage is supplied to the word lines adjacent to the selected word lines in an initial precharge operation of a channel. Accordingly, the boosting efficiency of the channel increases.

Figure 5:
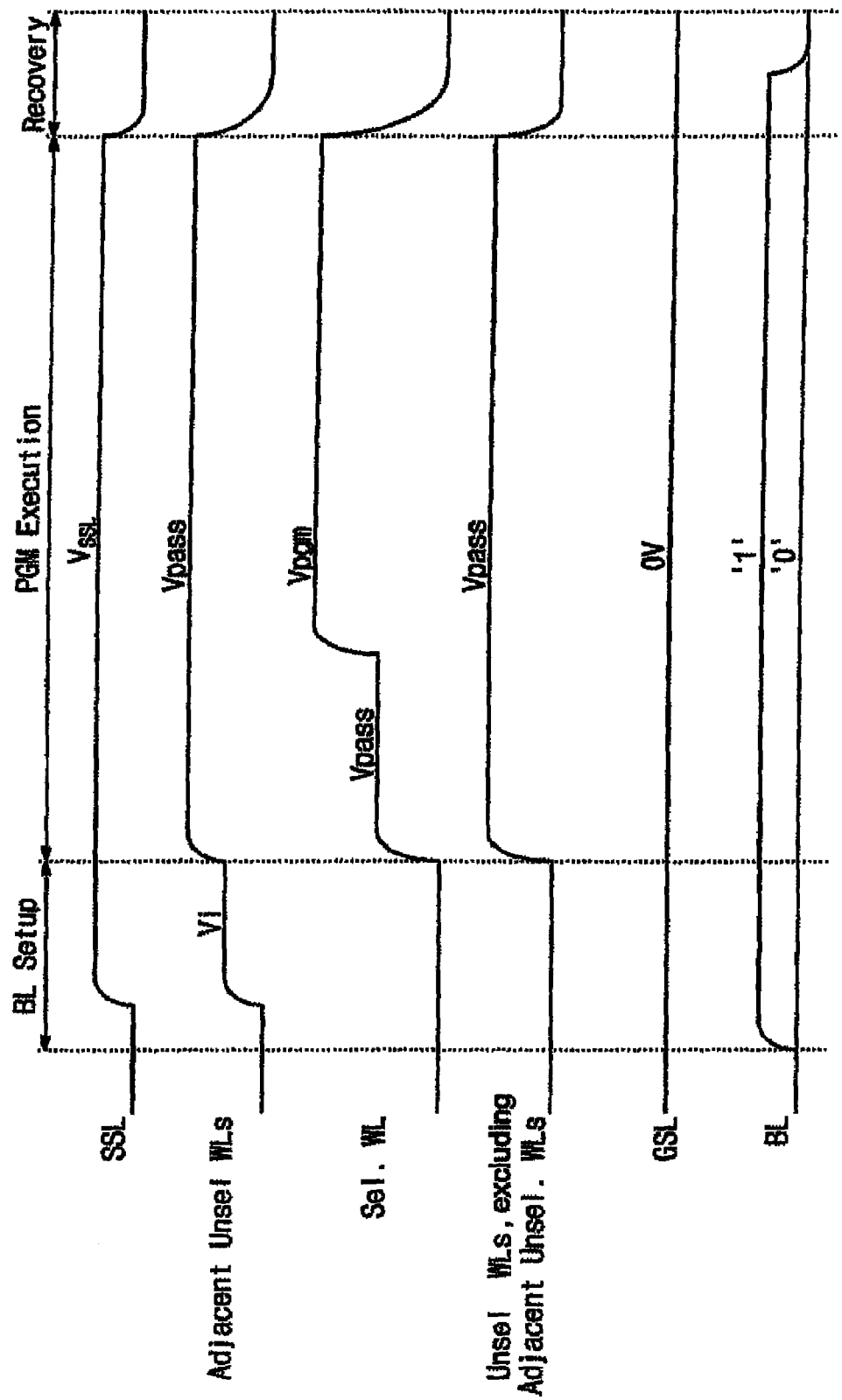
FIG. 5 is a timing diagram of a programming method of nonvolatile memory device of an embodiment of the inventive concept.

FIG. 5 is a first timing diagram of a programming method according to a nonvolatile memory device of an embodiment of the inventive concept. The programming operation of the embodiment will be described below with reference to the timing diagram of FIG. 5.

The programming operation may be mainly divided into a bit line set-up interval, programming operation interval, and a program recovery interval.

A data loading is performed before program operation moves onto the bit line set-up interval. The nonvolatile memory device 100 receives as input a program command, an address and data from an external device. The inputted data is loaded to page buffers (not shown) of the input/output buffer circuit 130. The nonvolatile memory device 100 generates high-voltages for performing programming operation while the data is loaded. The high-voltages are generated in a high-voltage generator (not shown) in the high-voltage generator/control logic 140.

Upon completion of the data loading, the bit line set-up interval is performed. In the bit line set-up interval, the bit lines BL0-BLn−1 are set up based on the data loaded in page buffers. In other words, a program voltage corresponding to data '0' (e.g., 0V) is provided to bit lines connected to cells to be programmed, and a program-inhibited voltage (e.g., power voltage Vcc) corresponding to data '1' is provided to bit lines connected to cells of which programming is to be inhibited. In a programming operation, the respective bit lines BL0-BLn−1 retain data until program recovery operation is performed. Also 0V is supplied to the ground selection line GSL during a programming operation.

Also, in the bit line set-up interval of the embodiment, the channels of the selected memory blocks are precharged to increase efficiency of self-boosting in a programming operation. In other words, an initial charge is charged in the channels of the selected memory blocks. This is referred to as the initial charge operation of the channel. The selected memory block means a memory block selected based on inputted address ADDR. Referring to FIG. 5, in a bit line set-up interval, a select voltage VSSL is supplied to a string selection line SSL of a selected memory block of which a programming operation is to be performed. And at the same time an initializing voltage Vi is supplied to word lines adjacent to selected word line. Here, the select voltage VSSL is a threshold voltage or a voltage higher than the threshold voltage for turning on the string selection transistor SST, and the initializing voltage Vi is a voltage for turning on the programmed memory cells or a voltage higher than this. The initializing voltage Vi of the embodiment is not limited to the voltage for turning on the programmed memory cells or a voltage higher than this. The initializing voltage Vi may be higher than a voltage of 0V.

Also, in the bit line set-up interval, 0V is supplied to unselected word lines and the selected word line, excluding word lines adjacent to the selected word lines which have the initializing voltage Vi supplied thereto as shown in FIG. 5.

The program operation interval is performed after the bit line set-up interval is performed. Here, the program operation interval may be divided into a pass voltage activation interval and a program voltage activation interval.

In the pass voltage activation interval, a pass voltage Vpass is supplied to word lines WL0-WLm−1 of the selected memory block based on inputted address ADDR, and power voltage Vcc is supplied to the string selection line SSL, and the ground voltage 0V of the ground selection line GSL is retained. Here, the pass voltage Vpass is a voltage for preventing F-N tunneling from occurring in the program-inhibited cells, and is a lower level than the program voltage Vpgm.

In the program voltage activation interval, the program voltage Vpgm is supplied to the word line Sel WL selected based on inputted address ADDR, i.e., word line connected to the memory cells to be programmed. A pass voltage Vpass of the unselected word lines Unsel WLs, power voltage Vcc of the string selection line SSL, and the ground voltage 0V of the ground selection line GSL are retained. Thereby, programming operation is performed by F-N Tunneling in the cells to be programmed that are connected to bit lines to which ground voltage 0V corresponding to data '0' is supplied.

A program recovery interval is performed after the programming operation. In the program recovery interval, voltages of the word lines WL0-WLm−1 and voltage of the string selection line SSL are discharged, and after a predetermined time, voltages of bit lines BL0-BLn−1 are discharged. Then a program verify read operation may be performed to determine whether the program is performed properly.

Figure 6:
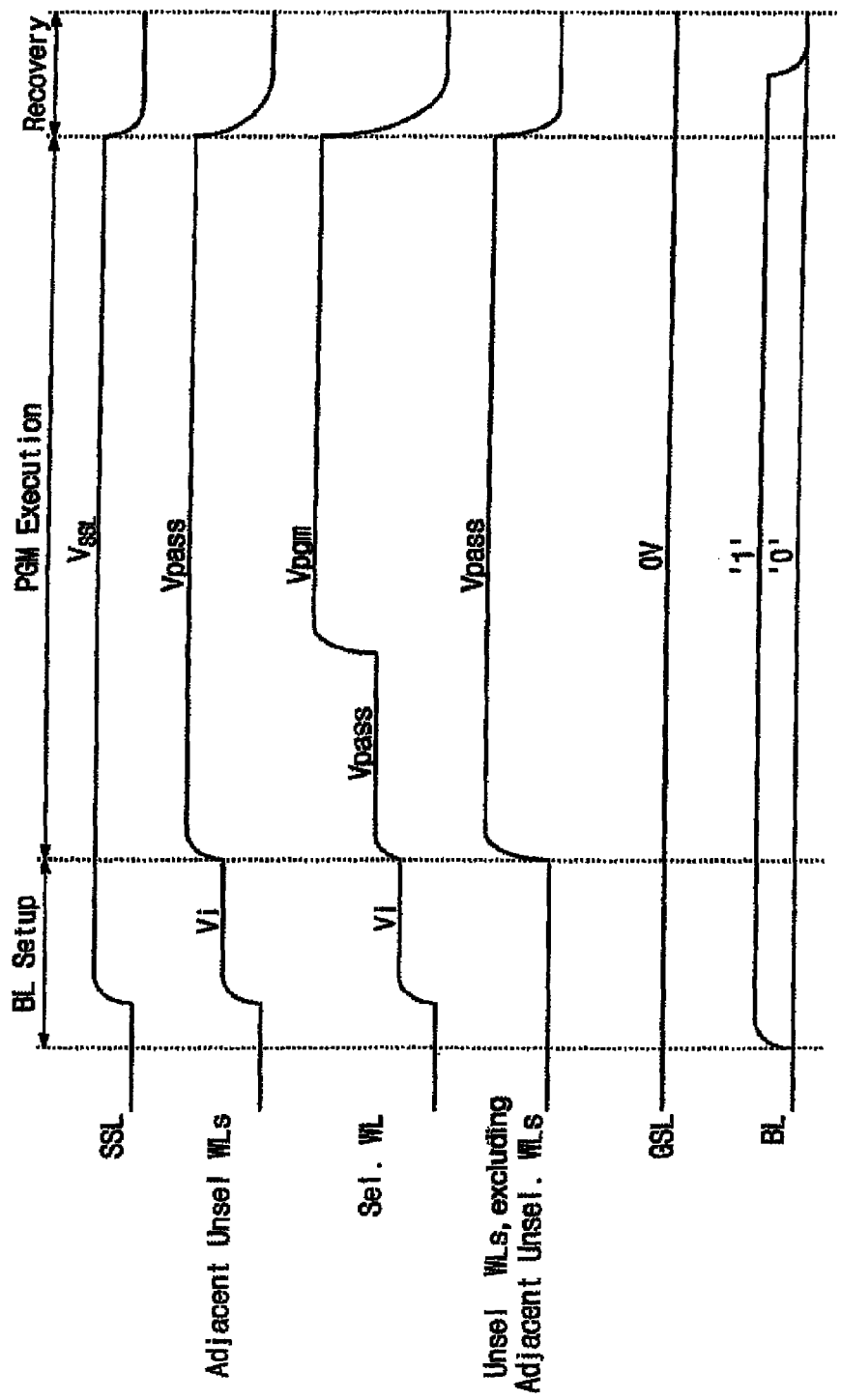
FIG. 6 is a timing diagram of a programming method of a nonvolatile memory device of a second embodiment of the inventive concept.

In the programming method illustrated in FIG. 5, 0V is supplied to the word line selected in a bit line set-up interval, however the embodiments of the inventive concept are not limited to this. FIG. 6 is a timing diagram illustrating a programming method of a nonvolatile memory device according to a second embodiment of the inventive concept. Referring to FIG. 6, an initializing voltage Vi is supplied to the word line Sel. WL selected in the bit line set-up interval.

In FIG. 1 to FIG. 6, an initializing voltage Vi is supplied to the word lines adjacent to the bit line set-up interval, however, the embodiment of the inventive concept is not limited to this.

Figure 7:
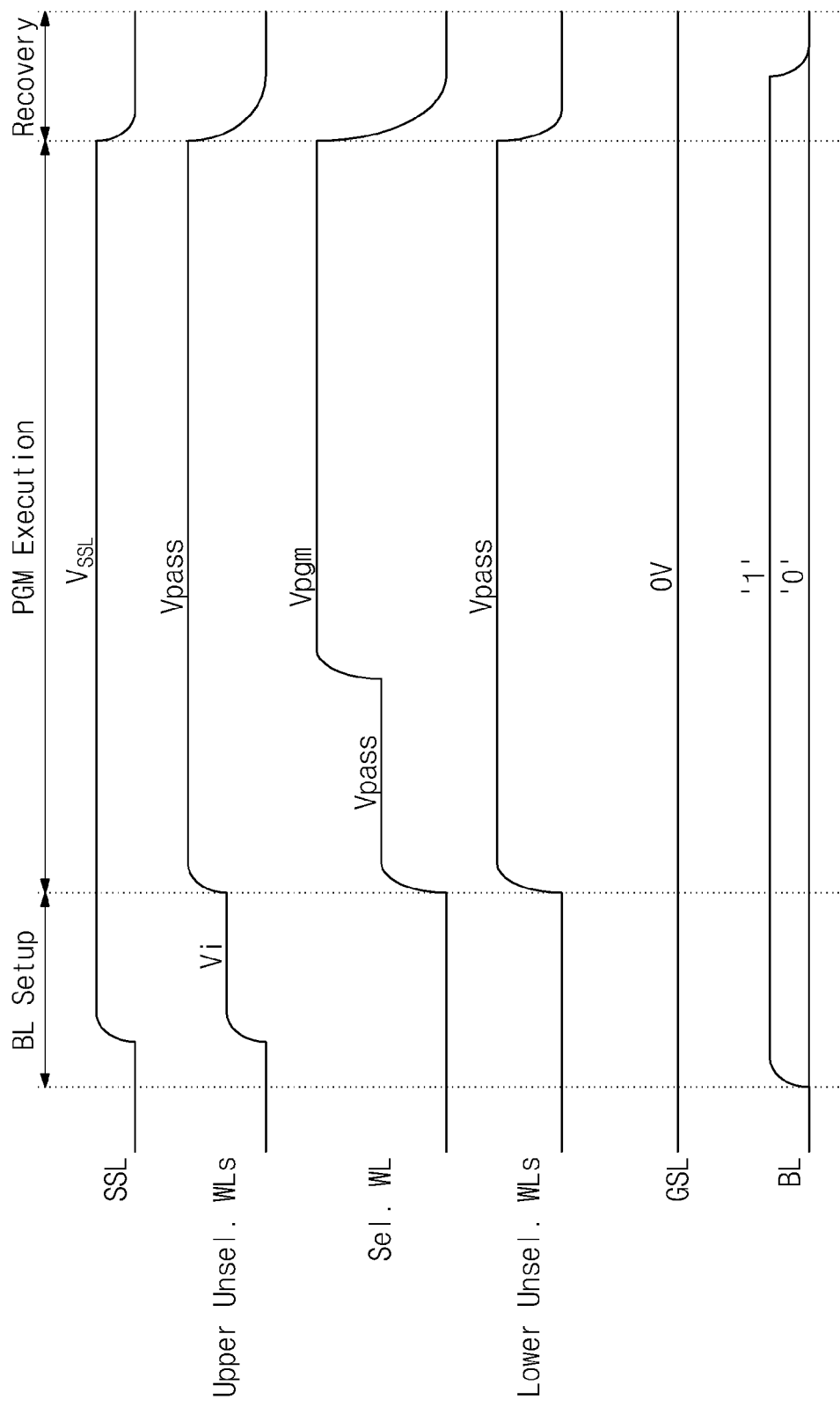
FIG. 7 is a timing diagram of a programming method of a nonvolatile memory device of a third embodiment of the inventive concept.

FIG. 7 is a timing diagram illustrating a programming method of a nonvolatile memory device of a third embodiment of the inventive concept. Referring to FIG. 7, an initializing voltage Vi is supplied to unselected upper word lines upward from the word line Sel. WL selected in the bit line set-up interval. Here, the unselected upper word lines refer to the word lines from the word line directly above the selected word line Sel. WL to the word line WLm−1 under the string selection line SSL.

Figure 8:
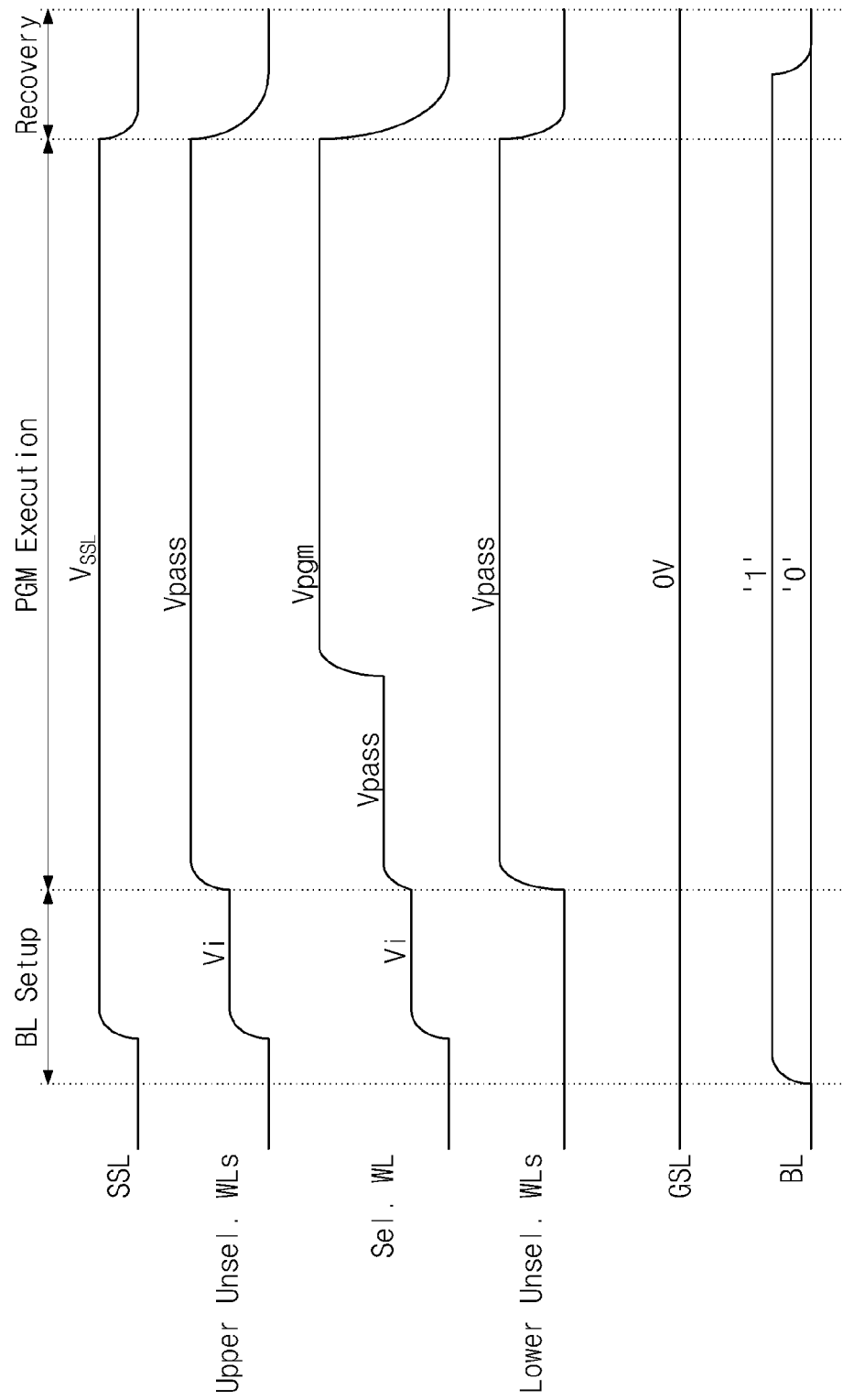
FIG. 8 is a timing diagram of a programming method of a nonvolatile memory device of a fourth embodiment of the inventive concept.

FIG. 8 is a timing diagram illustrating a programming method of a nonvolatile memory device of a fourth embodiment of the inventive concept. Referring to FIG. 8, an initializing voltage Vi is supplied to selected word line Sel. WL and unselected upper word lines Upper unsel. WLs of the bit line set-up interval.

Figure 9:
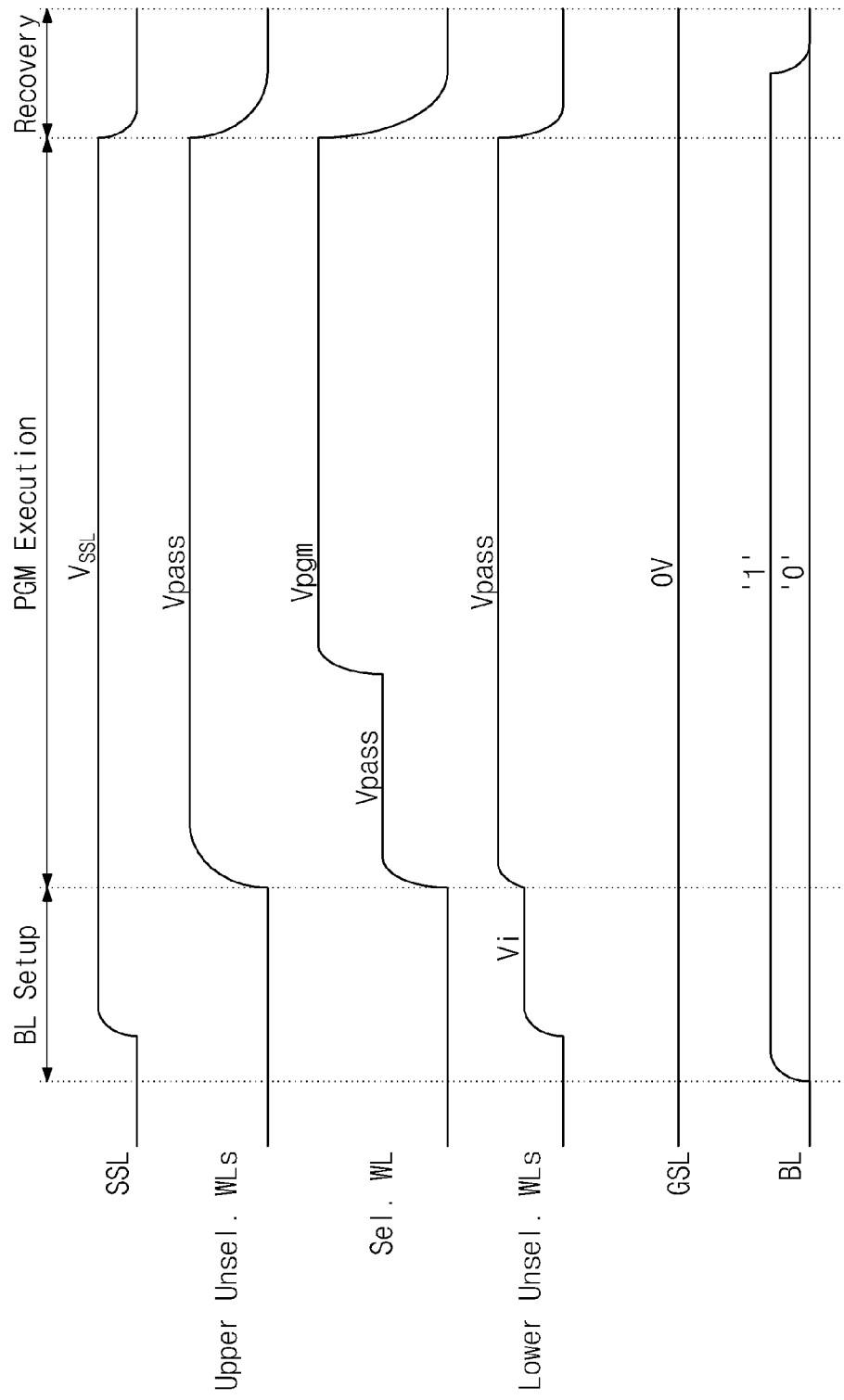
FIG. 9 is a timing diagram of a programming method of a nonvolatile memory device of a fifth embodiment of the inventive concept.

FIG. 9 is a timing diagram illustrating a programming method of a nonvolatile memory device of a fifth embodiment of the inventive concept. Referring to FIG. 9, an initializing voltage Vi is supplied to unselected lower word lines downward from the word line Sel. WL selected in the bit line set-up interval. Here, the unselected lower word lines refer to the word lines from directly under the selected word lines Sel. WL to the word line WL0 above the ground selection line GSL.

Figure 10:
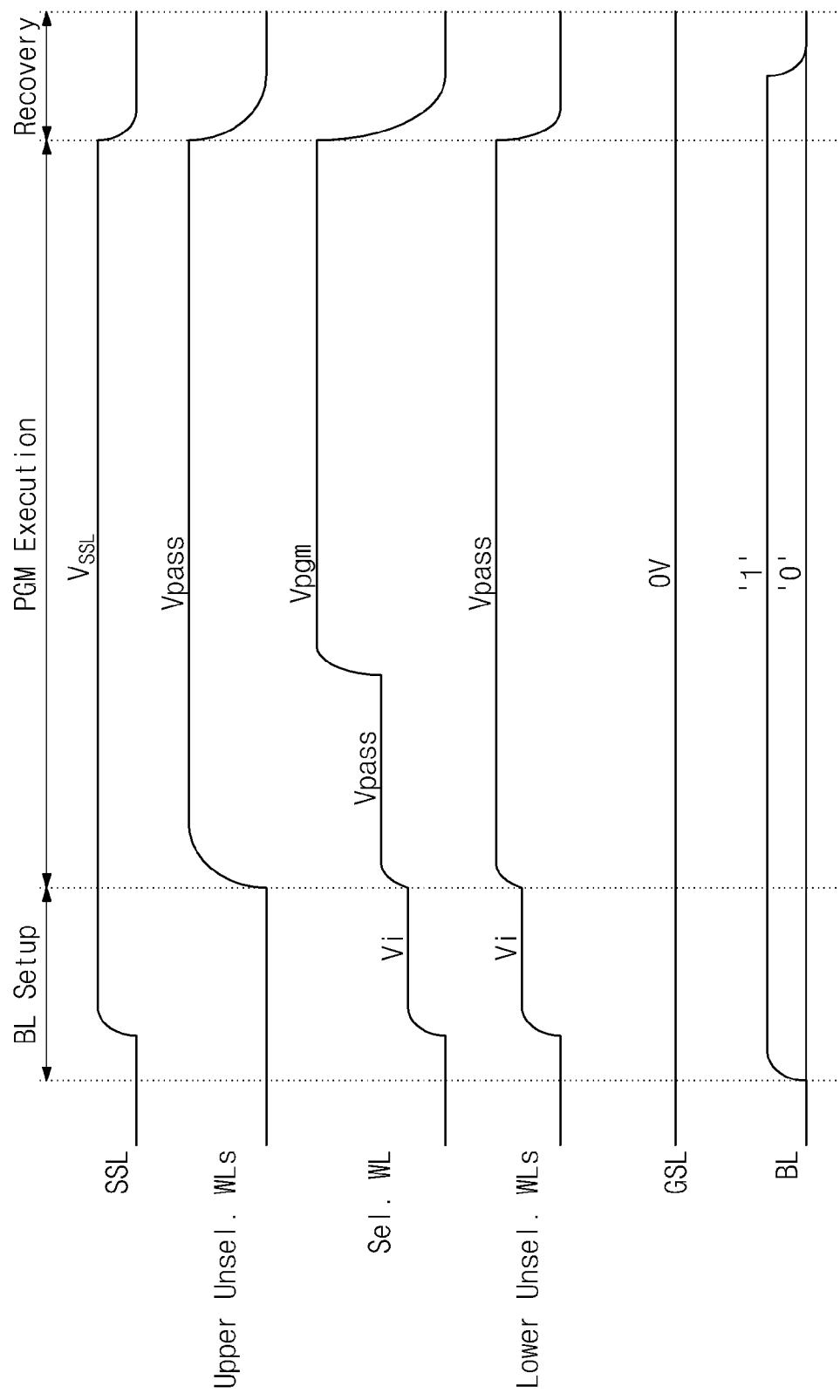
FIG. 10 is a timing diagram of a programming method of a nonvolatile memory device of a sixth embodiment of the inventive concept.

FIG. 10 is a timing diagram illustrating a programming method of a nonvolatile memory device of a sixth embodiment of the inventive concept. Referring to FIG. 10, an initializing voltage Vi is supplied to the selected word line Sel. WL and the unselected lower word lines Lower unsel. WLs in the bit line set-up interval.

Figure 11:
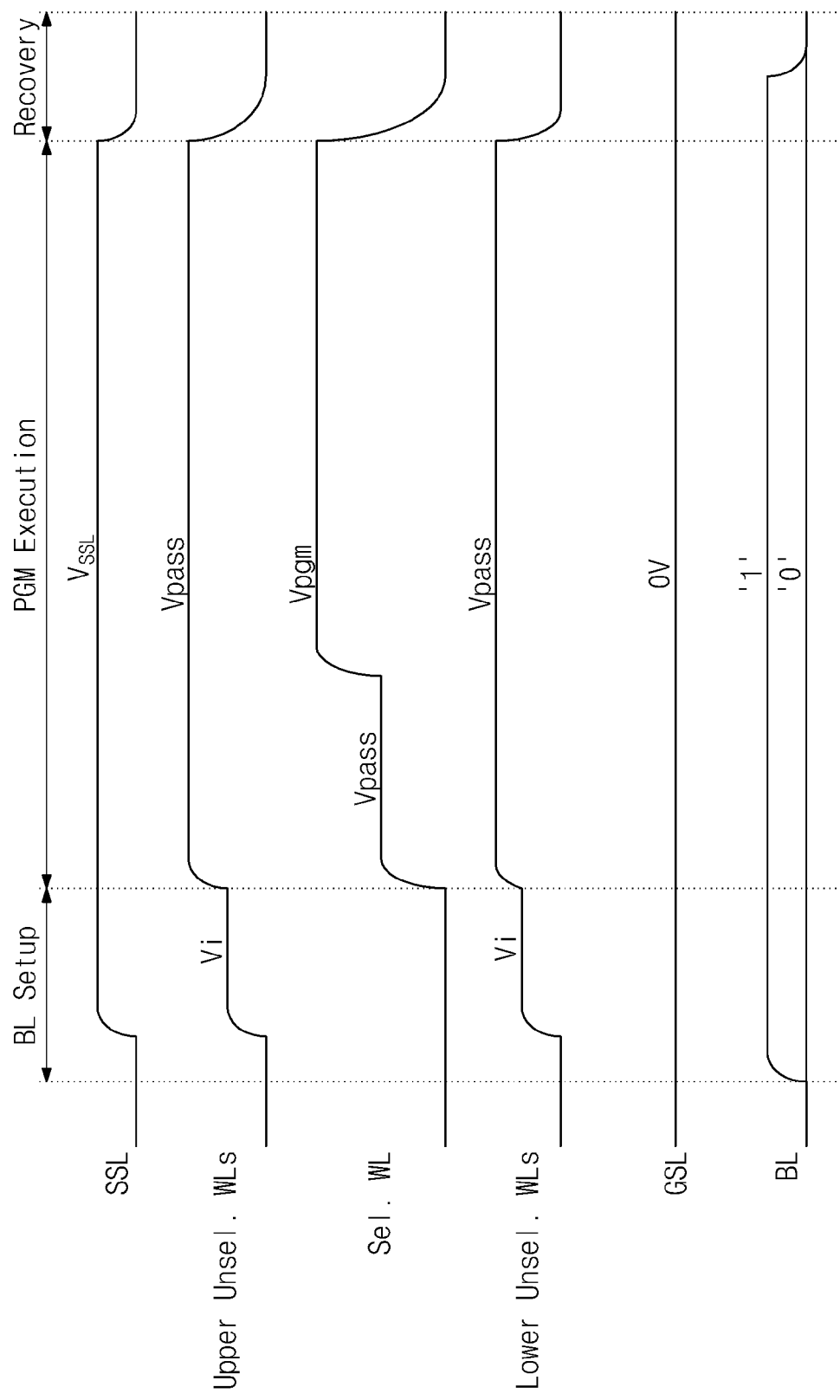
FIG. 11 is a timing diagram of a programming method of a nonvolatile memory device of a seventh embodiment of the inventive concept.

FIG. 11 is a timing diagram illustrating a programming method of a nonvolatile memory device of a seventh embodiment of the inventive concept. Referring to FIG. 11, an initializing voltage Vi is supplied to unselected upper word lines Upper unsel. WLs and unselected lower word lines Lower unsel. WLs in the bit line set-up interval.

Figure 12:
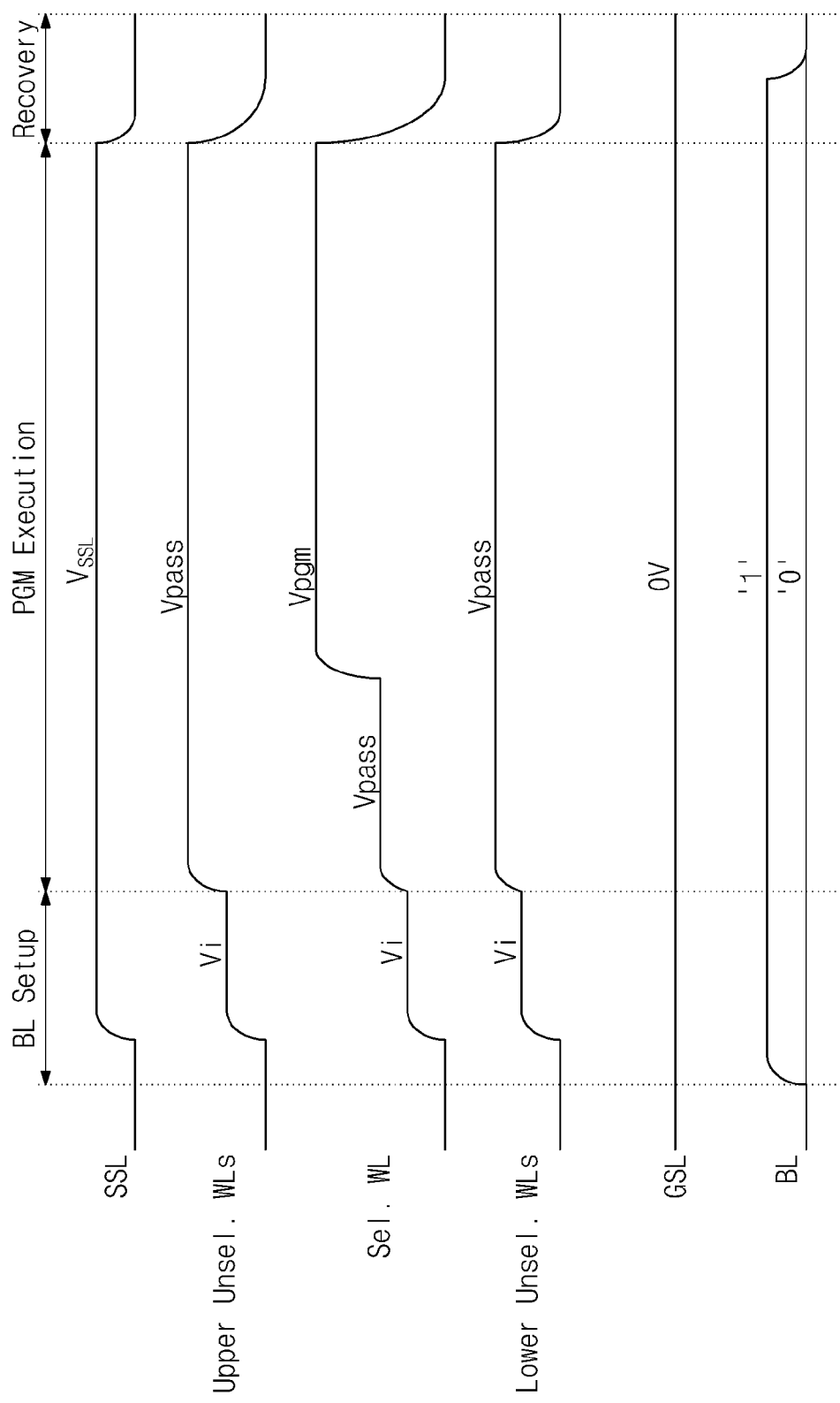
FIG. 12 is a timing diagram of a programming method of a nonvolatile memory device of an eighth embodiment of the inventive concept.

FIG. 12 is a timing diagram illustrating a programming method of a nonvolatile memory device of an eighth embodiment of the inventive concept. Referring to FIG. 12, an initializing voltage Vi is supplied to selected word line Sel. WL, unselected upper word lines Upper unsel. WLs and unselected lower word lines Lower unsel. WLs in the bit line set-up interval.

Figure 13:
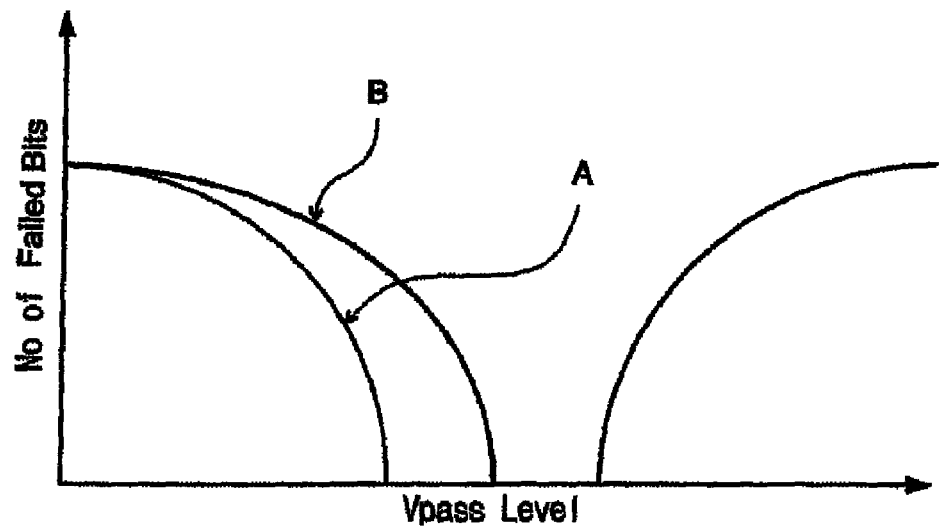
FIG. 13 depicts respective pass voltage windows of nonvolatile memory devices of embodiments of the inventive concept and a typical nonvolatile memory device.

FIG. 13 depicts respective pass voltage windows of nonvolatile memory devices of embodiments of the inventive concept as indicated in part by line A and a typical nonvolatile memory device as indicated in part by line B. Referring to FIG. 13, the horizontal axis indicates pass voltage, and the vertical axis indicates the number of failed bits. In FIG. 13, the pass voltage window of the nonvolatile memory device according to the inventive concept can be seen to be more extended or wider than the typical nonvolatile memory device. This means that the effect of program disturbances in the nonvolatile memory device in accordance with the inventive concepts is decreased as compared to typical non-volatile memories.

Figure 14:
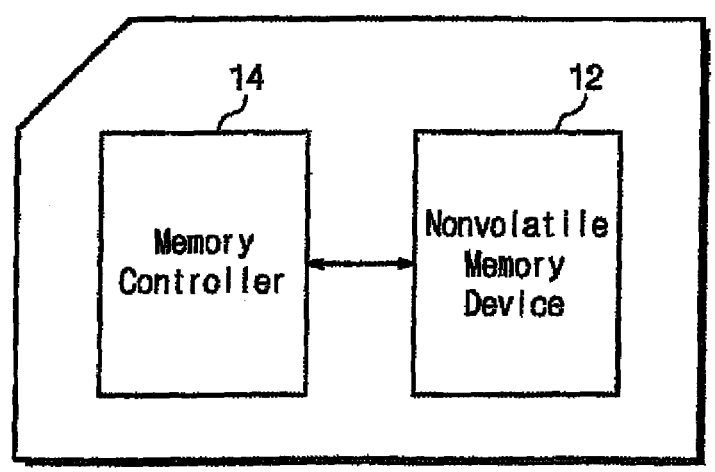
FIG. 14 depicts a memory card including a nonvolatile memory device according to an embodiment of the inventive concept.

FIG. 14 depicts a memory card 10 having the nonvolatile memory device 100 according to an embodiment of the inventive concept. Referring to FIG. 14, the memory card 10 includes a nonvolatile memory device 12 having the same configuration as that in FIG. 1, and a memory controller 14 for controlling nonvolatile memory device 12. Such memory card 10 is used to store/read information in digital devices such as digital cameras, PDAs, portable audio devices, cellular phones, and personal computers.

Figure 15:
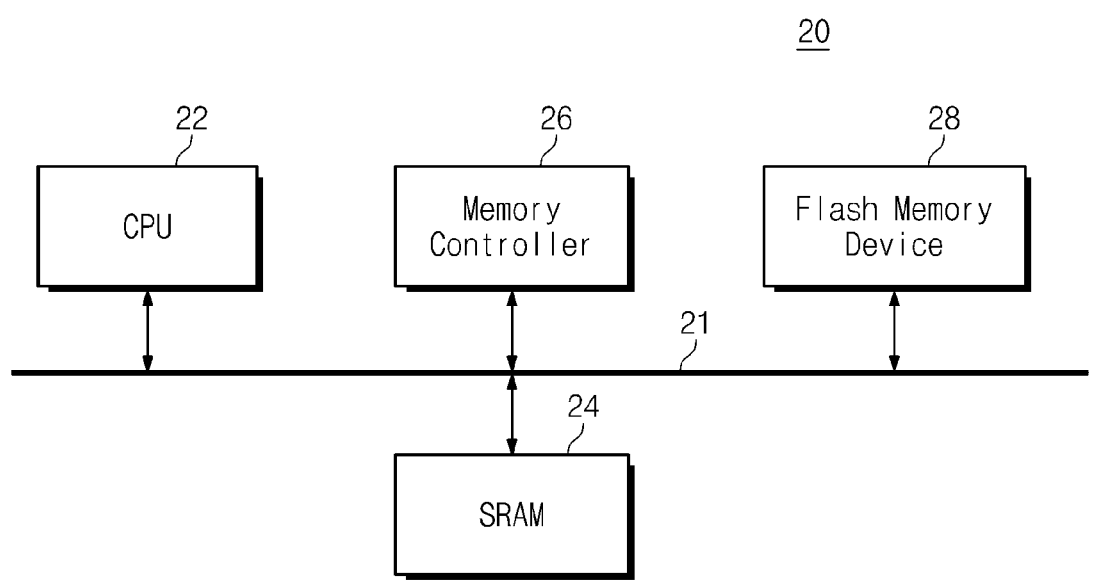
FIG. 15 is a memory system including a nonvolatile memory device according to an embodiment of the inventive concept.

FIG. 15 is a block diagram depicting a memory system 20 having a nonvolatile memory device according to an embodiment of the inventive concept. Referring to FIG. 15, the memory system 20 includes a CPU 22 electrically connected to a bus 21, SRAM 24, memory controller 26 and a flash memory device 28. Here, the flash memory device 28 will be configured in the same way as depicted in FIG. 1. In the flash memory device 28, N-bit data (N is an integer greater than or equal to 1) processed/to-be-processed by the CPU 22 will be stored by the memory controller 26.

Although not shown in drawings, in the memory system 20 of the embodiment of the inventive concept, an application chipset, a camera image processor (CIS), or a mobile DRAM may be further applied. The memory controller and the flash memory device may be configured, for example, like a solid state drive/disk (SSD) using a nonvolatile memory device to store data.

The flash memory and/or the controller according to embodiments of the inventive concept may be mounted using various forms of packages. The flash memory and/or the controller 120 may be mounted using packages, for example, PoP(Package on Package), Ball grid arrays(BGAs), Chip scale packages(CSPs), Plastic Leaded Chip Carrier(PLCC), Plastic Dual In-Line Package(PDIP), Die in Waffle Pack, Die in Wafer Form, Chip On Board(COB), Ceramic Dual In-Line Package(CERDIP), Plastic Metric Quad Flat Pack(MQFP), Thin Quad Flatpack(TQFP), Small Outline(SOIC), Shrink Small Outline Package(SSOP), Thin Small Outline(TSOP), Thin Quad Flatpack(TQFP), System In Package(SIP), Multi Chip Package(MCP), Wafer-level Fabricated Package(WFP), Wafer-Level Processed Stack Package(WSP).

Although the embodiments of the inventive concept have been described in connection with the accompanying drawings, the inventive concept should not be limited thereto. Persons with skill in the art will recognize that embodiments of the inventive concept may be applied to other types of memory devices. The above-disclosed subject matter is to be considered illustrative and not restrictive, and intended to cover all such modifications, enhancements, and other embodiments which fall within the true spirit and scope of the inventive concept. Thus, to the maximum extent allowed by law, the scope of the inventive concept is to be determined by a broadest permissible interpretation, and shall not be restricted or limited by the foregoing detailed description.

What is claimed is:

1. A programming method of a nonvolatile memory device, comprising:
   precharging bit lines of the nonvolatile memory device based on loaded data;
   boosting channels corresponding to the respective precharged bit lines, after supplying word lines adjacent to a selected word line of the nonvolatile memory device with an initializing voltage, the selected word line is a word line selected for programming; and
   supplying a word line voltage for programming to the channels, after the channels are boosted.

2. The method of claim 1, wherein the initializing voltage is higher than 0V.

3. The method of claim 1, wherein the initializing voltage is a voltage sufficient to turn on a programmed cell of the nonvolatile memory cell.

4. The method of claim 1, wherein the adjacent word lines are at least one or more upper word lines of the nonvolatile memory cell located upward from the selected word line, or at least one or more lower word lines of the nonvolatile memory cell located downward from the selected word line.

5. The method of claim 1, wherein the initializing voltage is supplied to the selected word line during said boosting the channels.

6. The method of claim 1, wherein the channels are boosted by the precharged bit lines being electrically connected to the channels, during said boosting of the channels.

7. The method of claim 1, wherein said supplying the word line voltage comprises:
   supplying a program voltage to the selected word line; and
   supplying a pass voltage to unselected word lines.

8. A programming method of a nonvolatile memory device comprising:
   precharging bit lines of the nonvolatile memory device based on loaded data;
   boosting channels corresponding to the respective precharged bit lines, after an initializing voltage is supplied to word lines of the nonvolatile memory device including from a word line located upwardly adjacent a selected word line to a word line adjacent a string selection line, or to word lines of the nonvolatile memory device including from a word line located downwardly adjacent the selected word line to a word line adjacent a ground selection line, the selected word line is a word line selected for programming; and
   supplying a word line voltage for programming the channels, after the channels are boosted.

9. A programming method of a nonvolatile memory device, comprising:
   precharging bit lines of the nonvolatile memory device based on loaded data;
   boosting channels corresponding to the respective precharged bit lines, after supplying a plural number of word lines immediately adjacent both sides of a selected word line of the nonvolatile memory device with a initializing voltage and maintaining word lines other than the plural number of word lines immediately adjacent both sides of the selected word lines at zero voltage, the selected word line is a word line selected for programming and the initializing voltage is greater than zero; and
   supplying a word line voltage for programming the channels, after the channels are boosted.

10. The method of claim 9, wherein the initializing voltage is lower than a pass voltage sufficient to turn on a programmed cell of the nonvolatile memory device.

11. The method of claim 9, wherein said supplying the word line voltage comprises:
   supplying a program voltage to the selected word line; and
   supply a pass voltage to unselected word lines.

* * * * *